US006586533B1

(12) United States Patent
Landi et al.

(10) Patent No.: US 6,586,533 B1
(45) Date of Patent: *Jul. 1, 2003

(54) METHOD OF MANUFACTURE OF POLYBUTADIENE AND POLYISOPRENE BASED THERMOSETTING COMPOSITIONS

(75) Inventors: Vincent R. Landi, Danielson, CT (US); J. Mark Mersereau, Brooklyn, CT (US); Walter A. Robbins, Dayville, CT (US); Michael E. St. Lawrence, Thompson, CT (US)

(73) Assignee: World Properties, Inc., Lincolnwood, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 08/238,178

(22) Filed: May 4, 1994

Related U.S. Application Data

(63) Continuation-in-part of application No. 08/052,138, filed on Apr. 23, 1993, now abandoned, which is a continuation of application No. 07/349,595, filed on May 9, 1989, now Pat. No. 5,223,568, which is a continuation-in-part of application No. 07/050,243, filed on May 14, 1987, now abandoned.

(51) Int. Cl.$^7$ .............................................. C08C 19/28
(52) U.S. Cl. ........................... 525/315; 525/70; 525/87; 525/88; 525/89; 525/99; 525/236; 525/237; 525/281; 525/304; 525/305; 525/314; 525/316; 524/403; 524/413; 524/424; 524/430; 524/433; 524/434; 524/456; 524/571; 524/575; 427/123; 264/331.13
(58) Field of Search ................................ 524/571, 575, 524/404, 413, 424, 430, 433, 434, 456; 528/481; 525/70, 88, 89, 87, 236, 237, 281, 304, 305, 314, 315, 316; 264/331.13; 427/123

(56) References Cited

U.S. PATENT DOCUMENTS

| | | | | |
|---|---|---|---|---|
| 2,797,208 A | * | 6/1957 | Burke, Jr. ............... 528/481 X |
| 3,642,687 A | | 2/1972 | Naarmann et al. .......... 525/237 |
| 3,644,584 A | | 2/1972 | Fryd .......................... 260/879 |
| 3,860,672 A | | 1/1975 | Legally ...................... 260/859 |
| 3,919,133 A | | 11/1975 | Dawans et al. ............. 525/237 |
| 4,017,436 A | | 4/1977 | Tabana .................. 260/27 BB |
| 4,113,800 A | | 9/1978 | Lee, Jr. ................. 260/876 B |
| 4,197,377 A | | 4/1980 | Bohm ......................... 525/99 |
| 4,229,550 A | | 10/1980 | Jones ........................ 525/282 |
| 4,241,132 A | | 12/1980 | Pratt et al. .................. 428/285 |
| 4,267,080 A | | 5/1981 | Yokoyama et al. ......... 260/4 R |
| 4,268,433 A | | 5/1981 | Sawatari ..................... 525/193 |
| 4,370,448 A | | 1/1983 | Leland ........................ 525/99 |
| 4,384,066 A | | 5/1983 | O'Shea ....................... 524/394 |
| 4,499,240 A | | 2/1985 | Valentine .................... 525/193 |
| 4,554,470 A | | 11/1985 | Jerson et al. ............... 524/449 |
| 4,587,300 A | | 5/1986 | Valentinue .................. 525/95 |
| 4,600,745 A | | 7/1986 | Creighton ................... 525/236 |
| 4,704,318 A | | 11/1987 | Saito et al. ................. 428/209 |
| 4,789,708 A | | 12/1988 | Guzy .......................... 525/237 |
| 4,820,764 A | | 4/1989 | Guzy et al. ................. 524/526 |
| 4,997,702 A | | 3/1991 | Gazit et al. ................. 428/283 |
| 5,223,568 A | | 6/1993 | Landi et al. ................ 524/526 |
| 5,264,065 A | | 11/1993 | Kohm ......................... 156/307 |
| 5,930,459 A | | 7/1999 | Eckman et al. ............. 392/503 |

FOREIGN PATENT DOCUMENTS

| | | |
|---|---|---|
| CH | 26 48 595 | 5/1977 |
| DE | 25 39 412 | 3/1976 |
| DE | 2648595 | 5/1977 |
| EP | 0 202 488 | 11/1986 |
| EP | 0 220 160 | 4/1987 |
| EP | 0 234 450 | 9/1987 |
| EP | 0 389 076 | 9/1990 |
| EP | 0 430 092 A3 | 6/1991 |
| EP | 0 460 539 A2 | 12/1991 |
| EP | 0 707 038 | 9/1995 |
| GB | 2 061 989 A | 5/1981 |
| GB | 2 172 892 A | 10/1986 |
| JP | 5375250 | * 4/1978 |
| JP | 6178871 | * 4/1986 |
| JP | Hei 4-258658 | 9/1992 |

OTHER PUBLICATIONS

Translation of 61/78871, Japan, Apr. 22, 1986.*
Translation of 1st Claim in 53/75250, Japan, Apr. 7, 1978.*
N. Sawatari, I. Watanabe, H. Okuyama and K. Murakawa, "A New Flame Retardant, 1,2–Polybutadiene Lamainate", pps. 131–137 Apr. 1983.
C.F. Chen, "Dielectric Properties of Polybutadiene and its Reinforced Composites at Room and Elevated Temperature" pps. 318–320.
Ronald E. Drake, "1,2–Polybutadienes–High performance Resins for the Electrical Industry", pps. 730–733.
Bruzzone et al., LaChimica E. L'Industria 47 (12) 1298–1302 (1965) "High–Termperature Thermal Cross–linking of Cistatic Polybutadiene" Dec. 1965.
Colorado Chemical Brochure—"Ricon Electrical Electronic".
Colorado Chemical Brochure—"Ricon Laminating Resins".
Barth et al., Modern Plastics, pp. 142–148, (Nov. 1970).

(List continued on next page.)

Primary Examiner—Fred Teskin
(74) Attorney, Agent, or Firm—Cantor Colburn LLP

(57) ABSTRACT

Articles are formed from a thermosetting composition based on polybutadiene or polyisoprene resins which are subjected to a high temperature cure step of greater than 250° C. The thermosetting compositions may include fillers such as particulate ceramic fillers and may also include woven webs for improved dimensional stability and decreased brittleness. The formation process of this invention is particularly well suited for making electrical circuit substrates for microwave and digital circuits, typically in the form of the thermosetting composition being laminated on one or both opposed surfaces to metal conductive foil (e.g., copper).

81 Claims, 3 Drawing Sheets

OTHER PUBLICATIONS

Colorado Chemical Brochure—"Ricon Molding Compound"—Feb. 1, 1980.
Colorado Chemical Brochure—"Ricon Product Bulletin"—Aug. 20, 1985.
Colorado Chemical Brochure—"Ricon Radome".
Nippon Soda Brochure—"Nisso—PB".
McCreedy et al., Polymer 20 Apr. 1979.

Chen, Tenth Electrical Insulation Conf., pp. 318–320, (1978)
Takeuchi et al., "Thermoplastic 1,2–13 polybutadiene," in New Industrial Polymers, ACS #4, pp. 15–25.
Bruzzone et al., LaChimica E L'Industria 47 (12) 1298–1302 Dec. 1965.
"High Vinyl 1–2 Liquid polybutadiene–Ricon Molding Compound CCS–110" Feb. 1, 1980 pub. Colorado Chemical Spec.

* cited by examiner

METHOD OF MANUFACTURE OF
POLYBUTADIENE AND POLYISOPRENE
BASED THERMOSETTING COMPOSITIONS

CROSS-REFERENCE TO RELATED APPLICATION

This is a continuation-in-part of application Ser. No. 08/052,138 filed Apr. 23, 1993 (now abandoned), which is a continuation of application Ser. No. 07/349,595 filed May 9, 1989 (now U.S. Pat. No. 5,223,568), which is a continuation-in-part of application Ser. No. 07/050,243 filed May 14, 1987 (now abandoned).

BACKGROUND OF THE INVENTION

This invention relates generally to a method of making thermosetting composites and the resulting product which preferably comprises electrical circuit laminate materials. More particularly, this invention relates to an electrical circuit laminate comprising a thermosetting resin of polybutadiene or polyisoprene which is subjected to a high temperature cure at a temperature of greater than about 250° C.; and which may optionally include (1) a second polymer which cross-links with the polybutadiene or polyisoprene resin; (2) a woven fibrous web impregnated with the resin; and (3) optional inorganic particulate filler such as silica, titania and the like.

Commonly assigned U.S. Pat. No. 5,223,568 (which is fully incorporated herein by reference) describes a thermosetting composition which is particularly useful for making electrical substrate materials. In general, U.S. Pat. No. 5,223,568 describes a composition formed from the steps of:

(a) providing a moldable thermosetting composition that includes 1) polybutadiene or polyisoprene resin which is a liquid at room temperature and which has a molecular weight less than 5,000 and 2) a solid butadiene or isoprene-containing polymer capable of cross-linking with the polybutadiene or polyisoprene resin;

(b) forming the composition into a shape; and (c) curing the composition to produce the electrical substrate material including subjecting the composition to a high temperature cure condition at a temperature greater than about 250° C. and less than the decomposition temperature of the composition. This composition thus comprises a two component system, the first component being the polybutadiene or polyisoprene resin and the second component being the solid butadiene or isoprene-containing polymer; all of which are subjected to the high temperature curing cycle (e.g., greater than 250° C.).

In preferred embodiments, the solid polymer is a thermoplastic elastomer block copolymer.

U.S. Pat. No. 5,223,568 also describes a composition with a dielectric filler (i.e., a material having a dielectric constant greater than about 1.2 at microwave frequencies) homogeneously dispersed throughout the composition to the extent that when the composition is cured the properties of the cured article, e.g., dielectric constant and coefficient of thermal expansion, do not vary more than about 5% throughout the article.

In preferred embodiments, the composition of U.S. Pat. No. 5,223,568 further includes a crosslinking agent capable of co-curing (i.e., forming covalent bonds) with the polybutadiene or polyisoprene resin thermoplastic elastomer, or both. Examples of preferred crosslinking agents include triallylcyanurate, diallylphthlate, divinyl benzene, a multi-functional acrylate, or combinations of these agents.

When the electrical substrate material includes a dielectric filler, the volume % of the filler (based upon the combined volume of resin, thermoplastic elastomer, crosslinking agent (if any) and filler) is between 5 and 80%, inclusive. Examples of preferred fillers include titanium dioxide (rutile and anatase), barium titanate, strontium titanate, silica (particles and hollow spheres); corundum, wollastonite, polytetrafluoroethylene, aramide fibers (e.g., Kevlar), fiberglass, $Ba_2Ti_9O_{20}$, glass spheres, quartz, boron nitride, aluminum nitride, silicon carbide, beryllia, or magnesia. They may be used alone or in combination.

The method disclosed in U.S. Pat. No. 5,223,568 provides a wide variety of shaped articles having favorable isotropic thermal and dielectric properties. These properties can be tailored to match or complement those of ceramic materials, including Gallium Arsenide, alumina, and silica. Thus, the cured articles can replace ceramic materials in many electronic and microwave applications, e.g., as specialized substrates for high speed digital and microwave circuits. Examples of microwave circuits including microstrip circuits, microstrip antennas, and stripline circuits. The cured products are also useful as rod antennas and chip carriers.

Circuit laminate materials of the type described in U.S. Pat. No. 5,223,568 are commercially available from Rogers Corporation, Rogers, Connecticut and sold under the trademark "TMM". Such circuit materials may be produced by initially casting a slurry of resin and filter followed by lamination (e.g., molding) and the high temperature cure cycle. While laminates produced by using an initial casting step exhibit excellent cost efficiencies and electrical properties, it has been determined that such materials do suffer from poor dimensional stability and exhibit undesirable brittleness. It has also been determined that the two component polybutadiene or polyisoprene based thermosetting composition described in U.S. Pat. No. 5,223,568 may not be desirable for all anticipated applications of the material, particularly when used as a circuit laminate material.

SUMMARY OF THE INVENTION

The above-discussed and other problems and deficiencies of the prior art are overcome or alleviated by the electrical substrate material of the present invention. In accordance with thee present invention, it has been discovered that:

(1) in a two component system, the first component (e.g., polybutadiene or polyisoprene resin) is not required to (a) be liquid at room temperature, (b) have a molecular weight less than 5,000, or (c) have pendent vinyl groups nor is the second component (e.g., the unsaturated butadiene—or isoprene-containing polymer) required to be a "solid" polymer;

(2) the thermosetting composition need not be a two component system; but instead may be comprised of a single polybutadiene or polyisoprene containing resin component (e.g., without the butadiene or isoprene-containing polymer) or the single resin component may comprise a polybutadiene or polyisoprene containing polymer such as SBS triblock polymers;

(3) woven or nonwoven fibrous webs may be incorporated into dielectric resins of the type described in U.S. Pat. No. 5,223,568 and in the resins systems of (1) and (2) above whereupon the deficiencies in the prior art related to undesirable dimensional stability and brittleness are dramatically improved with only a relatively small loss in electrical performance. In addition, the resulting electrical laminate may be produced at a relatively low cost thus permitting the use of the present invention in high volume applications, particularly high volume microwave applications and those uses requiring thin, low cost laminates.

The foregoing discovery is premised, at least in part, on the understanding that a critical part of the invention in U.S. Pat. No. 5,223,568 is heating the thermosetting material to a temperature greater than about 250° C. This high temperature cure step is unconventional for diene polymers such as polybutadiene or polyisoprene resins, with or without the presence of usual or other curatives such as peroxide or sulfur. Thus, it is the high temperature curing step of a polybutadiene or polyisoprene resin that defines this invention. The use of (a) a two component system, (b) a liquid resin, (c) a resin having a MW less than 5,000, (d); pendent vinyl groups, or (e) a solid butadiene or isoprene polymer are not required or even desirable under certain circumstances. The process of this invention thus comprises:

Two Component System

A forming process for producing an article such as an electrical circuit substrate comprising the steps of:

(a) providing a thermosetting composition comprising;
   a polybutadiene or polyisoprene resin; and
   an unsaturated polybutadiene or polyisoprene containing polymer capable of participating in cross-linking with said polybutadiene or polyisoprene resin during cure; and (b) curing said composition to produce said article (e.g., electrical circuit substrate) by subjecting said composition to a high temperature cure condition at a temperature greater than about 250° C. and less than the decomposition temperature of said composition.

One Component System

A forming process for producing an article such as an electrical circuit substrate comprising the steps of:

(a) providing a thermosetting composition comprising a polybutadiene or polyisoprene resin; and (b) curing said composition to produce said article (e.g., electrical circuit substrate) by subjecting said composition to a high temperature cure condition at a temperature greater than abut 250° C. and less than the decomposition temperature of said composition.

The electrical substrate material of this invention may also include a plurality of woven webs (such as E-glass webs) embedded in a mixture of the polybutadiene or polyisoprene based resin system and optional inorganic filler (e.g., silica) laminated between one or two sheets of conductive foils (e.g., copper) to produce a circuit board material which is especially well suited for microwave applications. Of course, if very thin (e.g., less than 5 mil thickness) cross-sections are desired, then only a single saturated web may be used for the dielectric.

The above-discussed and other features and advantages of the present invention will be appreciated and understood by those or ordinary skill in the art from the following detailed description and drawings.

BRIEF DESCRIPTION OF THE DRAWINGS

Referring now to the drawings, wherein like elements are numbered alike in the several FIGURES.

DESCRIPTION OF THE PREFERRED EMBODIMENT

Figure 1:
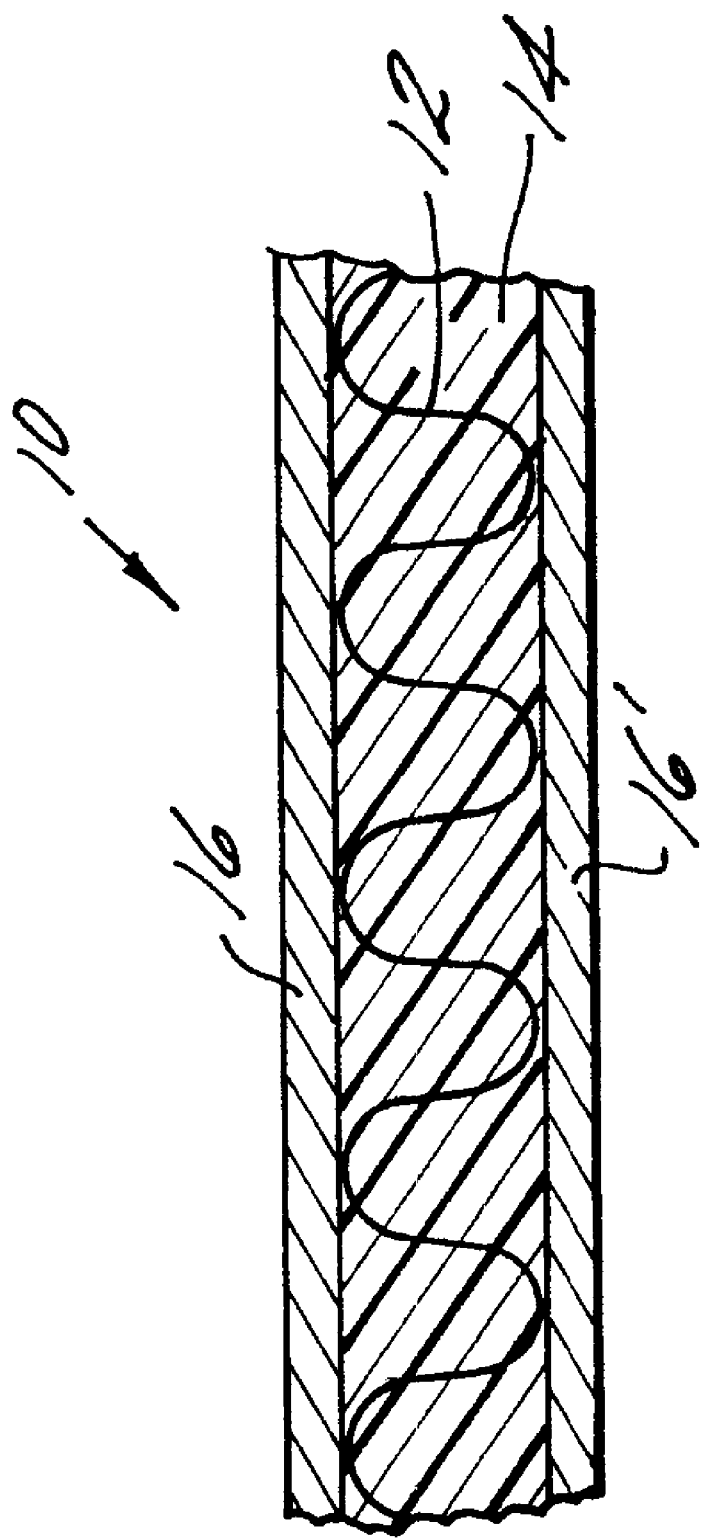
FIG. 1 is a cross-sectional elevation view of a circuit substrate material in accordance with the present invention.

U.S. Pat. No. 5,223,568 discloses compositions of 1) polybutadiene or polyisoprene resin which are liquid at room temperature and which have a molecular weight (number average) less than 5,000 and a large number of pendent vinyl groups (e.g., first component) and 2) a solid butadiene or isoprene containing polymer such as a thermoplastic elastomer (e.g., second component). A critical part of the invention is disclosed to be heating this material to a cure temperature which is unconventional for diene polymers, with or without the presence of usual or other curatives such as peroxide or sulfur, during which a very high degree of crosslinking is effected. It can be inferred that during this high temperature cure step, many existing covalent bonds are broken and many new bonds are formed, so as to increase the crosslinking between chain units to a remarkable degree. As will be discussed hereinafter, it is the high temperature cure of a polybutadiene or polyisoprene resin system that defines this invention. It has been discovered that the use of (a) a liquid resin or (b) a resin having a MW less than 5,000 or (c) a solid butadiene or isoprene polymer are simply optional embodiments for the polybutadiene or polyisoprene resin system.

More particularly, it has been discovered that the molecular weight of the polybutadiene or polyisoprene resin is not critical to these remarkable reactions described above. Mixing equipment is well able to mix a high molecular weight polymer with another, and also to disperse large amounts of filler in such polymeric mixtures. The liquid resins mentioned in U.S. Pat. No. 5,223,568 were convenient for preparing compounds which could be processed facilely with more filler, and molded in more different ways (due to fewer limitations imposed by high viscosity) than would be obtainable using higher molecular weight polymers. Indeed, it is a common practice to compound and mold high molecular weight rubber with large amount of filler (e.g. carbon blacks, silicas, etc.). The chemical reactions due to the high temperature (greater than 250° C.) are expected to take place between proximately placed polymer chain units, be they from low or high molecular weight polymer molecules. The end result is still a remarkable degree of network formation, although it may take even fewer crosslinking reactions starting with high molecular weight polymer. (In other words, under some circumstances, the high temperature cure cycle may be reduced with a high molecular weight resin). The polymers of the polybutadiene or polyisoprene resin therefore need to be neither liquid nor limited to 5000 molecular weight or less.

It has likewise been discovered that the reference to "solid " butadiene or isoprene containing resins (e.g., the second component) are also not critical to the remarkable reactions described above. As will be discussed in detail hereinafter, the unsaturated butadiene or isoprene containing polymer may be a liquid as well as a solid; and indeed, this second component need not even be present in the polybutadiene or polyisoprene resin system so long as the high temperature cure take place.

U.S. Pat. No. 5,223,568 relies on an unusual high temperature cure condition, which is capable of developing extremely high degrees of cure in certain common polymeric materials. The unexpected nature of the discovery embodied in U.S. Pat. No. 5,223,568 is exemplified by the uniqueness of the results, which provides a highly sought result in the area of polymeric circuit substrates for use in making high frequency and high signal transmission speed circuits. These attributes include dielectric properties, stable over broad ranges of temperature and frequency; and resistance to rigors of circuit fabrication operations.

What makes the invention disclosed in U.S. Pat. No. 5,223,568 particularly desirable, is that these properties are achieved using common and relatively inexpensive polymeric starting materials; polymers and copolymers of butadiene or isoprene. Performance as a dielectric material is even superior to very expensive thermosetting or rigid high temperature thermoplastic polymeric materials (e.g., benzocyclobutene polymers, cyanate ester polymers, polyimides, polyether ether ketones and others). This is due to low dissipation factor, the absence of an abrupt polymeric transition up to at least 300° C. (which cause unwanted increases in thermal expansion and shifts in dielectric constant and dissipation factor), low dissipation factor, relatively low dielectric constant, low water absorption, and high resistance to caustics and organic solvents used in circuit board manufacture. The rigidity of the material makes it superior in some circuit fabrication operations to another high quality (but soft) polymer for circuit substrates, polytetrafluoroethylene.

The polymeric system as described in U.S. Pat. No. 5,223,568 was aimed at a specific useful embodiment of the concept of the invention. This was mixtures of liquid (low molecular weight) polybutadiene or polyisoprene polymer and rubbery (high molecular weight) butadiene or isoprene copolymers which were tailored to a mixing process available for their fabrication. The use of liquid rubber made possible very high loadings of filler without excessive viscosity of the mix. However, in accordance with the present invention, it has now been discovered that the liquid (or low molecular weight) polybutadiene or polyisoprene resin is not necessary to make a useful article. Instead, the polybutadiene or polyisoprene resin may be solid as well as liquid. For example, if the mixing were carried out using an appropriate organic solvent which was later evaporated after the product were formed (e.g., cast films), or, if significantly lower loadings of filler were used, such low molecular weight requirements could be removed. It has been determined that chemically similar polymers of either high molecular weight or low molecular weight (liquid) undergo essentially similar reactions at the very high cure temperatures of the invention. In Example 1 (as will be discussed below), the only polymer used is a high molecular weight polybutadiene rubber, mixed with high level of filler with the aid of xylene, which is solvent for the polymer.

The use of a high molecular weight rubbery component (e.g., second component) in addition to the liquid rubber (e.g., first component) in examples of U.S. Pat. No. 5,223,568 was to address other problems encountered when a liquid rubber was used. One of these was a tendency for the liquid resin to separate from the filler during certain molding operations, due to a sieving effect. This separation was unacceptable for highest quality dielectric materials where uniformity of dielectric constant is important throughout the circuit element, since filler separation would result in non-uniform dielectric constant. The styrene/butadiene/styrene rubbery copolymer was used to adjust viscosity to counteract this effect. But other high molecular weight butadiene polymer can be used. Example 3 shows that an acceptable product can be produced when in lieu of the SBS, a syndiotactic 1,2-polybutadiene rubber is used in combination with a liquid polybutadiene rubber.

The resin system, fillers, cross-linking agents, woven web, processing conditions and representative constructions together with Examples will now be discussed in detail.

Resin System

The resin system used in the electrical substrate material of this invention is a thermosetting composition generally comprising (1) a polybutadiene or polyisoprene resin (or mixture thereof); and (2) an optional unsaturated butadiene or isoprene-containing polymer capable of participating in cross-linking with the polybutadiene or polyisoprene resin during cure. The polybutadiene or polyisoprene resins may be liquid or solid at room temperature. Liquid resins may have a molecular weight greater than 5,000 but preferably have a molecular weight of less than 5,000 (most preferably between 1,000 or 3,000). The preferably liquid (at room temperature) resin portion maintains the viscosity of the composition at a manageable level during processing to facilitate handling. It also crosslinks during cure. Polybutadiene and polyisoprene resins having at least 90% 1,2 addition by weight are preferred because they exhibit the greatest crosslink density upon cure owing to the large number of pendent vinyl groups available for crosslinking. High crosslink densities are desirable because the electrical circuit substrates exhibit superior high temperature properties. A preferred resin is B3000 resin, a low molecular weight polybutadiene liquid resin having greater than 90 wt. % 1,2 addition. B3000 resin is commercially available from Nippon Soda, Ltd.

The unsaturated polymer preferably comprises a thermoplastic elastomer and more preferably includes a linear or graft-type block copolymer that preferably has a polybutadiene or polyisoprene block with at least 50% by weight, 1,2 addition and a thermoplastic block that preferably is styrene or α-methyl styrene. The high proportion of 1,2 addition in the polyisoprene or polybutadiene block leads to high crosslink densities after the curing step, as is the case with the polybutadiene or polyisoprene resin described above. A preferred copolymer is a styrene-butadiene-styrene triblock copolymer, e.g., Kraton DX1300 (commercially available from Shell Chemical Corp.).

U.S. Pat. No. 5,223,568 emphasizes polymers containing greater levels of 1,2-butadiene over 1,4-butadiene addition, this is because crosslinking occurs more readily and a more rapid cure is possible due to the pendent double bonds in the 1,2-form. But in accordance with yet another feature of the present invention, it has been discovered that the thermal reactions occurring in high 1,2-butadiene addition polymers, are also manifest in other butadiene polymers as described in more detail in Example 4. Example 4 demonstrates that in a single component system, the thermosetting composition may comprise an unsaturated butadiene or isoprene-containing polymer such as SBS copolymer.

The thermoplastic elastomer may also contain a second block copolymer similar to the first except that the polybutadiene or polyisoprene block is hydrogenated, thereby forming a polyethylene block (in the case of polybutadiene) or an ethylene-propylene copolymer (in the case of polyisoprene). When used in conjunction with the first copolymer, materials with greater "toughness" can be produced. Where it is desired to use this second block copolymer, a preferred material is Kraton GX1855 (commercially available from Shell Chemical Corp.) which is believed to be a mixture of styrene-high 1,2 butadiene-styrene block copolymer and styrene-(ethylene-propylene)-styrene block copolymer. Particularly preferred compositions are those in which the resin is polybutadiene, the first block copolymer is styrene-butadiene-styrene triblock copolymer (m=n=1), and the second block is styrene-(ethylene-propylene)-styrene triblock copolymer (m=n=1), the ethylene-propylene block being the hydrogenated form of an isoprene block.

Thus, in a preferred embodiment, the unsaturated polymer comprises a solid thermoplastic elastomer block copolymer having the formula $X_m(Y-X)_n$ (linear copolymer) or

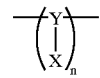

(graft polymer) where Y is a polybutadiene or polyisoprene block, X is a thermoplastic block, and m and n represent the average block numbers in the copolymer, m being 0 or 1 and n being at least 1. The composition may further include a second thermoplastic elastomer block copolymer having the formula $W_p\text{-}(Z\text{-}W)_q$ (linear copolymer) or

(graft copolymer) where Z is a polyethylene or ethylene-propylene copolymer block, W is a thermoplastic block, and p and q represent the average block numbers in the copolymer, p being 0 and 1 and q being at least 1.

Preferably, the polybutadiene or polyisoprene resin and the polybutadiene or polyisoprene block of the first block copolymer making up the thermoplastic elastomer have at least 90% by weight 1,2 addition. The volume to volume ratio of the polybutadiene or polyisoprene to the thermoplastic elastomer preferably is between 1:9 and 9:1, inclusive.

Crosslinking Agent

A crosslinking agent having a functionality ≧2 is added to the thermosetting composition to increase crosslink density upon cure. Examples of preferred crosslinking agents include triallyl cyanurate, diallyl phthalate, divinyl benzene, and multifunctional acrylate monomers (e.g., Sartomer resins available from Arco Specialty Chemicals Co.), or combinations thereof, all of which are commercially available. The volume % of the crosslinking agent as a percentage of the combined volume of the resin, thermoplastic elastomer, and crosslinking agent is preferably less than or equal to 20.

Filler Material

When the resin system of this invention includes a dielectric filler, the volume % of the filler (based upon the combined volume of resin having a molecular weight less than 5,000, thermoplastic elastomer, crosslinking agent (if any) and filler) is between 5 and 80%, inclusive and preferably between 40% and 70%. Examples of preferred fillers include titanium dioxide (rutile and anatase), barium titanate, strontium titanate, silica (particles and hollow spheres) including fused amorphous silica; corundum, wollastonite, polytetrafluoroethylene, aramide fibers (e.g., Kevlar), fiberglass, $Ba2Ti_9O_{20}$, glass spheres, quartz, boron nitride, aluminum nitride, silicon carbide, beryllia, or magnesia. They may be used alone or in combination Particularly preferred fillers are rutile titanium dioxide and amorphous silica because these fillers have a high and low dielectric constant, respectively, thereby permitting a broad range of dielectric constants combined with a low dissipation factor to be achieved in the final cured product by adjusting the respective amounts of the two fillers in the composition. To improve adhesion between the fillers and resin, coupling agents, e.g., silanes, are preferably used.

As will be discussed hereinafter, the material described herein is preferably used as a dielectric substrate in a circuit laminate wherein a layer of metal is laminated thereto. Preferably, the filler material and quantity thereof is selected so as to provide the substrate with a coefficient of thermal expansion which is equal or substantially equal to the coefficient of thermal expansion of the metal layer.

Curing Agent

A curing agent is preferably added to the composition to accelerate the curing reaction. When the composition is heated, the curing agent decomposes to form free radicals, which then initiate crosslinking of the polymeric chains. Preferred curing agents are organic peroxides e.g., Luperox, dicumyl peroxide, and t-butylperbenzoate, all of which are commercially available.

Woven Web

The fiber reinforcement comprises woven; thermally stable webs of a suitable fiber, preferably glass (E, S, and D glass) or high temperature polyester fibers (Kodel from Eastman Kodak). The web is present in an amount of about 5 to 45 weight percent with respect to the entire laminate. Such thermally stable fiber reinforcement (having thermal stability of ≧250° C.) provide the laminate with a means of controlling shrinkage upon cure within the plane of the laminate. In addition, the use of the woven web reinforcement renders a dielectric substrate with a relatively high mechanical strength.

Preferred examples of the woven fiberglass web used in the present invention are set forth in the following Table 1.

TABLE 1

| Manufacturer | Style | Thickness (in.) |
|---|---|---|
| Fiber Glast | 519-A | 0.0015 |
| Clark-Schwebel | 112 | 0.0032 |
| Clark-Schwebel | 1080 | 0.0025 |
| Burlington | 106 | 0.0015 |
| Burlington | 7628 | 0.0068 |

Processing

In general, the thermosetting compositions are processed as follows. First, all the ingredients (polybutadiene or polyisoprene resin, thermoplastic elastomer, fillers coupling agent) are thoroughly mixed to form a slurry in conventional mixing equipment along with a peroxide curing agent. The mixing temperature is regulated to avoid substantial decomposition of the curing agent (and thus premature cure). Mixing continues until the filler is uniformly dispersed throughout the resin. Filler may be pretreated with coupling agents (preferably silanes) in a separate step for more efficient use of the agents.

For those applications where the composition is to impregnate a woven web forming a prepreg, conventional prepreg manufacturing methods can be employed. Typically the web is impregnated with the slurry, metered to the correct thickness, and then the solvent removed to form a prepreg.

The lamination process entails a stack-up of one or more prepreg layers between one or two sheets of conductive foil (copper). This stack-up is then densified and cured via lamination or a combination of lamination and oven baking.

First, the stack-up is cured in a conventional peroxide cure step; typical cure temperatures are between 150 and 200° C. Next, the peroxide-cured stack-up is subjected to a high temperature cure step under an inert atmosphere to increase crosslink density. The temperature is greater than about 250° C. but less than the decomposition temperature of the resin (typically about 400° C). The high temperature cure can be observed to impart an unusually high degree of crosslinking to the final laminate. This high temperature cure is preferably carried out in an oven but can also be performed in a press, namely as a continuation of the initial lamination step.

Alternatively, if the polybutadiene or polyisoprene resin is solid, this solid resin is mixed with a solvent to form a solution well suited for casting. Thereafter, the solvent is removed and the cast resin system is subjected to the aforementioned cure cycle.

Referring now to FIG. 1, a cross-sectional view of electrical substrate material in accordance with the present invention is shown generally at 10. Electrical substrate 10 has been laminated in accordance with one of the processes described above wherein a woven web 12 is embedded in a resin system/filler composition 14 and laminated between two copper foils 16, 16' to produce a circuit board laminate. As discussed above with reference to the processing conditions, the resin system 14 may either be cast onto woven web 12 using known casting equipment or web 12 may be saturated by resin system 14 by sandwiching web 12 between a pair of bond plys formed from resin system 14 and laminating the stack up together with the copper cladding 16, 16'. While FIG. 1 depicts a single layer of woven web 12, it will be appreciated that typically a plurality of layers of saturated web 12 will be used in forming circuit laminates in accordance with the present invention. However, a single layer as shown in FIG. 1 is desirable where very thin cross-sections (less than 5 Mils) are required.

EXAMPLES

The following non-limiting examples further describe the electrical substrate material of the present invention.

The following examples 1–4 employ Japan Synthetic Rubber, RB 810 and RB 830 syndiotactic 1,2-polybutadiene (on the order of 200,000 molecular weight, 90% 1,2-addition, respectively); Nippon Soda B3000 liquid 1,2-polybutadiene (>90% 1,2-butadiene addition, about 3000 molecular weight); Shell Chemical Kraton D1300 SBS thermoplastic elastomer (butadiene block about 40 to 50% 1,2-butadiene addition from manufacturer's information), Harbison Walker GP 7I silica, E-glass fiber, gamma-mercaptopropyltrimethoxysilane, t-butylperoxybenzoate, and dicumyl peroxide.

TABLE 2

(ingredients in wt %)

|  | Ex. 1 | Ex. 2 | Ex. 3 | Ex. 4 |
|---|---|---|---|---|
| RB 810 (solid 1, 2-PBD) | 17.67 |  |  |  |
| RB 830 (solid 1, 2-PBD) |  |  | 10.79 |  |
| B 3000 (liquid 1, 2-PBD) |  | 10.40 |  |  |
| B 1300 (Styrene/butadiene/styrene) |  | 7.27 | 7.81 | 33.82 |
| Silica | 81.32 | 79.86 | 78.95 | 66.18 |
| E glass fiber |  | 1.46 | 1.44 |  |
| Mercapto silane | 0.6 | 0.6 | 0.60 |  |
| t-Butyl peroxybenzoate | 0.12 | 0.12 | 0.12 |  |
| Dicuml peroxide | 0.29 | 0.29 | 0.29 |  |

Example 1 and Comparison Example 2

Example 1 was made by dissolving RB 810, syndiotactic 1,2-polybutadiene in xylene and mixing it with silica, mercaptosilane, and two peroxide curatives; (Table 1 for proportions). The mixing was accomplished by rolling the components with ceramic media overnight on a ball mill at room temperature. The thoroughly mixed solvent slurry was cast as sheets and allowed to dry overnight in a hood to remove the xylene. Material was then dried further at 125° F. for 2 hours in an explosion proof, oven. The dried material molded easily using compression molding into ½" thick×2" diameter discs, and ⅛"×½"×5" bars. Transfer molding of the material was not possible into the ⅛" bars due to very high viscosity. The molded pieces were postcured at 300° C. for 2 hours in nitrogen.

Comparison Example 2 has the same composition as Example 1 with two exceptions. The main exception is that the RB 810 syndiotactic 1,2-polybutadiene is replaced by an equal volume percent of a mixture of B3000 liquid 1,2-polybutadiene and D1300 SBS (the mixture in a 3:2 ratio by volume of B3000 to D1300). The other exception, is a small amount of E glass fiber replacing some of the silica added as a processing aid. This material was made on conventional mixing equipment without any added solvent.

Example 3 is similar to Example 2 except the D1300 SBS is replaced by RB 830 syndiotactic 1,2-polybutadiene. (RB 810 and 830 are partially crystalline materials, melting points 71 ° C. and 105° C., respectively).

Example 4 is a composition of Kraton D1300 and silica only, without any added curative or other ingredients. The volume loading of silica is about 45%, which is over 15% lower than the above examples, since mixing took place on conventional polymer mixing equipment and excessive viscosity was undesirable. The material was molded two hours at 250° C., then a portion was postcured two additional hours at 300° C. under nitrogen. The examples show how properties change with the high temperature cure.

Discussion of Examples 1–4 and Table 3

Example 1, a rigid dielectric of high modulus, low dissipation factor, low coefficient of thermal expansion, low water absorption, and low organic solvent absorption, is comparable in relevant properties to Example 2. Example 1 shows that there is no reason not to use higher molecular weight polybutadiene (e.g., greater than 5000) than is associated with liquid polymers. The essence of the invention, that is, the compositions obtained by the unconventionally high temperature cure (e.g., greater than 250° C. ) of butadiene polymers, is preserved in Example 1. Example 1 also demonstrates that a single butadiene component (as opposed to a two component system) may be used, if it is appropriate to the mixing and forming processes used.

Example 3 supports the conclusion that various high and low molecular weight butadiene-containing polymer components can be used when appropriate to the whole process.

Example 4 utilizes Kraton D1300 as the polybutadiene resin system. D1300 from Shell is a styrene/butadiene/styrene copolymer in which the center block contains, according to the manufacturer about 40 to 50% 1,2-butadiene addition, while the rest is 1,4-addition. Like other SBS thermoplastic elastomers, D1300 can be molded at moderate temperatures at which the polystyrene blocks soften. At room temperature, such a molded piece acts like a cured rubber, because of hard polystyrene domains which act as physical crosslinks, even though there are no chemical crosslinks. However, because of the uncrosslinked nature of the material, it can still be dissolved completely in a suitable solvent, such as tetrahydrofuran. Two 2" diameter discs of D1300 containing no curatives were molded at about 150° C. One of these discs was exposed to a 300° C. postbake step under an atmosphere of nitrogen. The transformation was dramatic. The unpostbaked material was flexible, rubbery and soft. The postbaked material was hard, rigid and brittle plastic. Quarter sections of the discs were placed into tetrahydrofuran and in 1,1,1-trichloroethane. The unpostbaked materials disintegrated and were significantly dissolved within 4 hours. After one day, the unpostbaked materials were completely disintegrated into a cloudy solution or slurry. The postbaked material remained intact and visibly unaffected upon removal of the specimens after one day.

Example 4 thus demonstrates that a ceramic powder filled dielectric substrate can also be based on Kraton D1300 subjected to the high temperature cure operation of U.S. Pat. No. 5,223,568. Example 4 shows the unique combination of unusual cure condition and butadiene polymers transforms an inherently rubbery material to a useful hard plastic, i.e. a new composition of matter.

TABLE 3

|  | Example 1 | Example 2 | Example 3 | Example 4 A-250° C./2 hr | Example 4 B-250° C./2 hr + 300° C./2 hr in N$_2$ |
|---|---|---|---|---|---|
| Flexual Strength (psi) | 9700 | 16530 | 9650 | | |
| Flexural Modulus (Mpsi) | 1.72 | 1.72 | 1.73 | | |
| Coefficient of Thermal Expansion (ppm/° C.) (0–140° C.) | 21.6 | 15.6 | | 80 | 47.8 |
| Dielectric Constant (10 GHz) | 3.2 | 3.25 | 3.23 | | 3.10 |
| Dissipation Factor (3 GHz) | 0.0012 | 0.0016 | 0.0014 | | 0.0007 |
| Water Absorption (1/8" 50° C./48 hours) | 0.03 | 0.04 | | | |
| Solvent Absorption (%) (16 hours/RT, 0.028" thick unless noted) | | | | | |
| Trichloroethylene | 0.03% (1/8") | | | 57.6 | 14.5 |
| Acetone | | 0.59 (1 week, .050") | | 3.7 | 0.3 |
| Methylene chloride | | | | 34.0 | 11.4 |

Example 5

A type 1080 E-glass woven web (45 g/m$^2$) was impregnated using a resin/filler/solvent slurry having the formulations set forth in Table 4 for samples A–R. The web was impregnated by dipping the web in the slurry and then running it through a nip. Once impregnated, the material was then placed in an oven where the solvent was evaporated leaving a prepreg. Two or more sheets were then placed together in between 2 copper foils in a stack-up and then laminated at 1000 psi for 3 hours at 300° C.

TABLE 4

| Sample | Thkns | % Volresin | % Web | % Filler | SpG | Flat[1] | Copper Bond (pli) | DimStab | Brittle[2] | Construction |
|---|---|---|---|---|---|---|---|---|---|---|
| A | 0.018 | 79 | 21 | 0 | 1.31 | −2 | | | 0 | 5 ply laminate using 0% silica |
| B | 0.011 | 62 | 38 | 0 | 1.53 | −4 | | | 0 | 5 ply laminate using 0% silica |
| C | 0.015 | 29.7 | 10 | 60.3 | 1.88 | 0 | 3.3 | | 3 | 2 play sat. web-65% SiO2-web in |
| D | 0.015 | 29.7 | 10 | 60.3 | 1.85 | 0 | 2.2 | | 3 | 2 play sat. web.-65% SiO2-web out |
| E | 0.015 | 29.7 | 10 | 60.3 | 1.86 | 0 | 3.2 | | 3 | 2 play sat. web -65% SiO2-web out |
| F | 0.013 | 46.6 | 11.6 | 39.8 | 1.66 | 4 | 2.7 | −0.152 | 2 | 45% mix-2 webs out-nonxylene |
| G | 0.012 | 46.1 | 12.6 | 39.3 | 1.66 | 3 | 2.6 | −0.164 | 2 | 45% mix-2 webs in-nonxylene |
| H | 0.012 | 42.6 | 18.9 | 36.5 | 1.71 | 1 | | −0.083 | 0 | 45% mix-3 plys-web out |
| I | 0.011 | 36.8 | 13.8 | 47.4 | 1.79 | 0 | 2.2 | −0.052 | 2 | 55% mix-2 webs out-nonxylene |
| J | 0.0125 | 37.8 | 12.1 | 48.3 | 1.78 | 0 | 1.9 | −0.053 | 3 | 55% mix-2 webs in-nonxylene |
| K | 0.0125 | 34.8 | 18.2 | 45 | 1.82 | −1 | | −0.06 | 0 | 55% mix-3 plys-web out |
| L | 0.011 | 54.1 | 13.8 | 30.2 | | | 3 | −0.118 | 2 | 35% mix-2 webs in-silane on cu |
| M | 0.01 | 53.2 | 15.4 | 29.7 | | | 3.7 | −0.16 | 2 | 35% mix-2 webs out-silane on cu |
| N | 0.02 | 65.9 | 15.1 | 17 | 1.44 | 1 | | −0.102 | 1 | 20% mix-4 webs (see 2054–56) |
| O | 0.014 | 35.8 | 16 | 46.2 | 1.77 | 1 | 4 | −0.054 | 1 | Minsil 20 sample-3 ply, 1080 glass w/Z6040 |
| P | 0.015 | 33.3 | 21.5 | 43.2 | 1.82 | 0 | 3.4 | −0.05 | 2 | Minsil 20-3 ply of 112 Greige glass |
| Q | 0.0115 | 34.1 | 19.8 | 44.1 | 1.8 | 1 | 3.8 | −0.063 | 1 | Minsil 05-3 ply 1080 w/Z6040 |
| R | 0.0145 | 33 | 22.3 | 42.8 | 1.83 | 0 | 3.2 | −0.05 | 2 | Minsil 05-3 ply 112 Greige glass |

Figure 2:
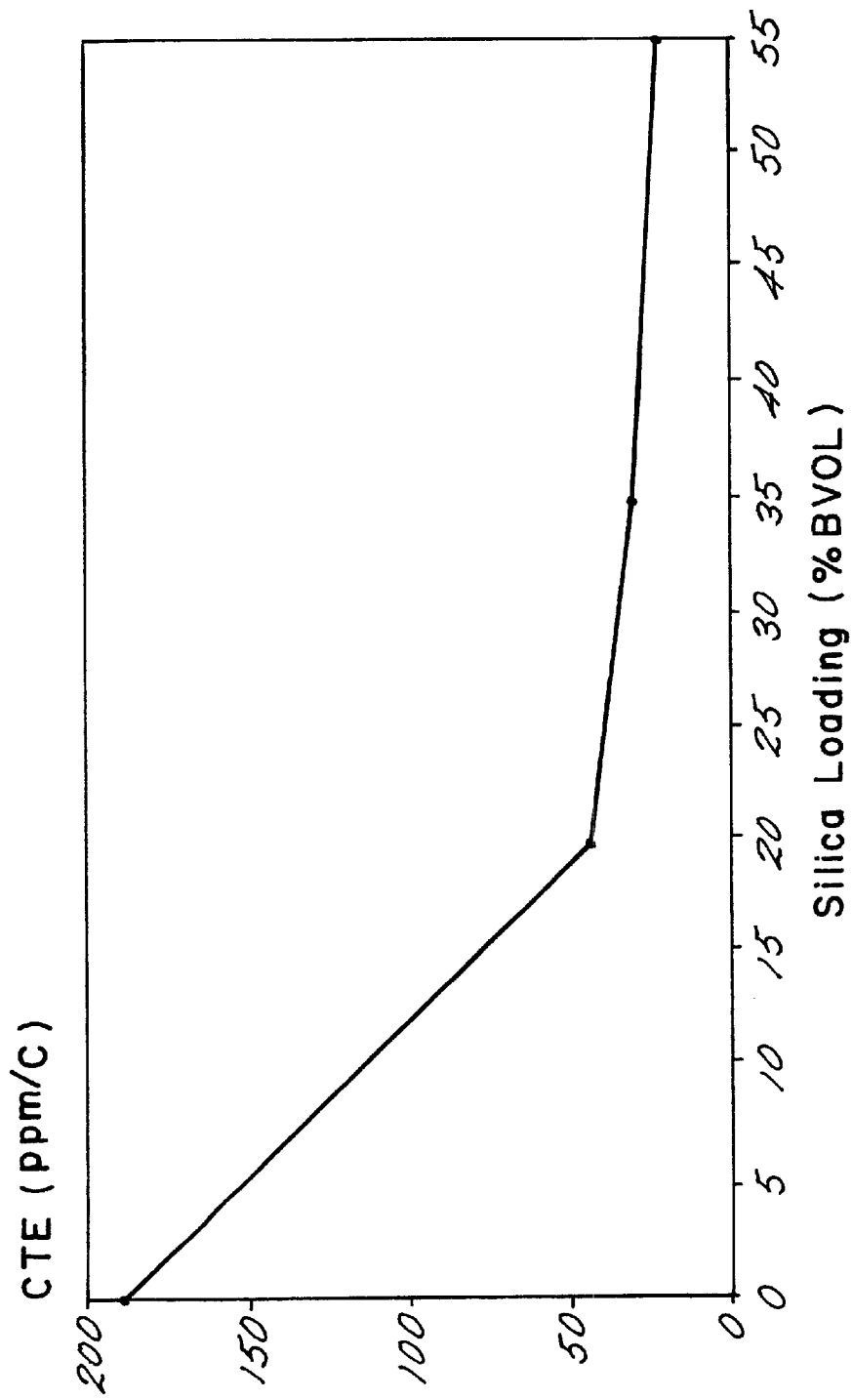
FIG. 2 is a graph depicting CTE vs filler loading in accordance with an embodiment of the present invention.
Figure 3:
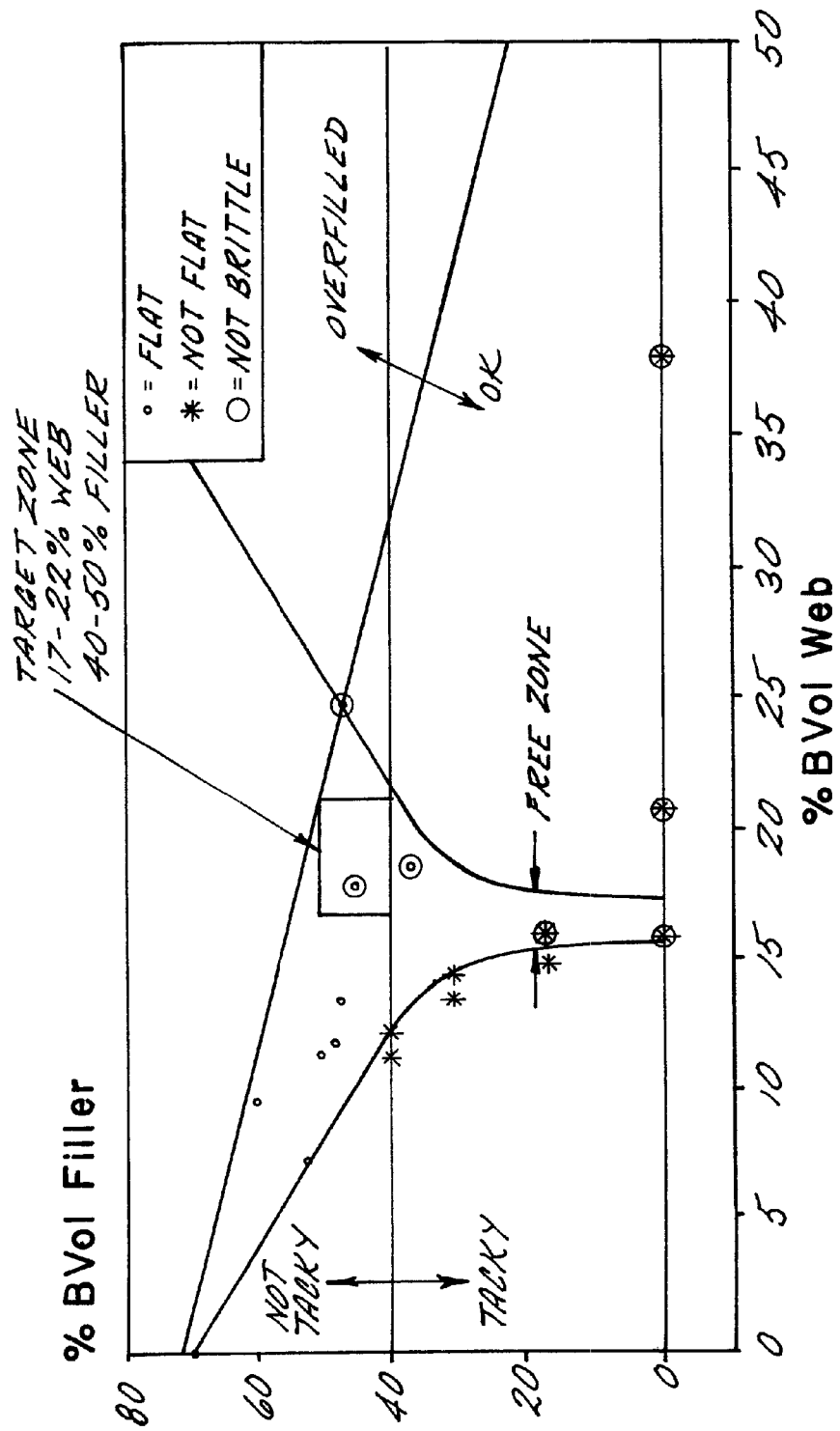
FIG. 3 is a graph depicting different combinations of filler and woven glass web loadings in the present invention.

Referring to Table 4 and FIGS. 2 and 3, the results of Example 5 indicate the following:

1. 40% by volume (of the total laminate) silica is required in order to make the prepreg adequately tack-free to be handled.
2. A woven fiberglass volume of greater than 15% is required to produce a non-brittle laminate.
3. The maximum volume of filler and fiberglass is 70%.
4. Flatness can be achieved with any filler content but the acceptable range of fiberglass contents increases with increasing filler content.

The foregoing examples further demonstrate that a woven web impregnated with a polybutadiene or polyisoprene based resin system which is laminated on one or both sides to conductive sheets and subjected to a high temperature cure cycle will produce a low cost electrical substrate material exhibiting both excellent electrical and mechanical properties.

While preferred embodiments have been shown and described, various modifications and substitutions may be made thereto without departing from the spirit and scope of the invention. Accordingly, it is to be understood that the present invention has been described by way of illustrations and not limitation.

What is claimed is:
1. A forming process for producing an article comprising:
providing a thermosetting composition comprising a polybutadiene or polyisoprene resin, and an unsaturated butadiene or isoprene containing copolymer capable of participating in crosslinking with said polybutadiene or polyisoprene resin, said unsaturated butadiene or isoprene containing copolymer comprises a liquid polymer; and
curing said composition to produce said article by subjecting said composition to a high temperature cure condition in an inert atmosphere at a temperature greater than about 250° C. and less than the decomposition temperature of said composition.

2. The forming process of claim 1 wherein:
said polybutadiene or polyisoprene resin is liquid at room temperature.

3. The forming process of claim 2 wherein:
said polybutadiene or polyisoprene resin has a number average molecular weight less than 5,000.

4. The forming process of claim 1 wherein:
said polybutadiene or polyisoprene resin has a number average molecular weight less than 5,000.

5. The forming process of claim 1 wherein:
said polybutadiene or polyisoprene resin is a solid at room temperature.

6. The forming process of claim 1 wherein:
said unsaturated butadiene or isoprene containing copolymer comprises a solid polymer.

7. The forming process of claim 1 wherein said polybutadiene or polyisoprene resin includes pendent vinyl groups available for crosslinking.

8. The forming process of claim 1 wherein said polybutadiene or polyisoprene resin includes pendent vinyl groups available for crosslinking.

9. The forming process of claim 1 wherein said unsaturated butadiene or isoprene containing copolymer has pendent vinyl groups available for crosslinking.

10. The forming process of claim 1 wherein said copolymer is a copolymer of isoprene or butadiene and a second monomer and wherein said second monomer is styrene or α-methyl styrene.

11. The forming process of claim 1 wherein said copolymer is a styrene-butadiene-styrene triblock copolymer.

12. The forming process of claim 11, wherein said copolymer further comprises a styrene-ethylene-propylene-styrene triblock copolymer.

13. The forming process of claim 1 further comprising adding to said composition one or more fillers.

14. The forming process of claim 13 adapted to produce a dielectric article wherein the added filler is a quantity of dielectric filler chosen to provide to said article a preselected dielectric constant, said added filler being dispersed substantially uniformly throughout said composition.

15. The forming process of claim 13 wherein:
said filler is a dielectric filler selected from the group consisting of titanium dioxide, barium titanate, strontium titanate, silica, corundum, wollastonite, polytetrafluoroethylene, aramide fibers, fiberglass, $Ba_2Ti_9O_{20}$, glass spheres, boron nitride, aluminum nitride, silicon carbide, beryllia, and magnesia.

16. The forming process of claim 13 wherein a plurality of said fillers having different dielectric constants are employed, the respective quantities of said fillers being selected to provide to said article a preselected dielectric constant.

17. The forming process of claim 13 therein said composition comprises between 5 and 80% volume, inclusive, of said filler.

18. The forming process of claim 17 further including:
a woven web impregnated by said polybutadiene or polyisoprene resin.

19. The forming process of claim 1 further including:
a woven web impregnated by said polybutadiene or polyisoprene resin.

20. The forming process of claim 17 further comprising applying to said article a metal layer having a preselected coefficient of thermal expansion and, in the process of forming said article, selecting said filler and the quantity thereof to provide to said article a coefficient of thermal expansion substantially equal to that of said metal layer.

21. The forming process of claim 1 further comprising adding a crosslinking agent to said thermosetting composition.

22. The forming process of claim 21 therein said crosslinking agent is selected from the group consisting of triallyl cyanurate, diallyl phthalate, divinylbenzene, a multifunctional acrylate monomer, and a combination thereof.

23. The forming process of claim 1 wherein curing said composition further includes adding catalyst to said composition and subjecting said composition, prior to said high temperature cure, to a catalyzed cure at a temperature less than the temperature of said high temperature cure.

24. The forming process of claim 1 wherein said thermosetting composition includes:
syndiotactic 1,2 polybutadiene rubber in combination with said polybutadiene or polyisoprene resin.

25. The forming process of claim 1 wherein said copolymer is a thermoplastic elastomer block copolymer having the formula $X_m$—$(Y-X)_n$ where formula Y is a block comprising isoprene or butadiene units, X is a thermoplastic block, and m and n represent the average block numbers in said copolymer, m being 0 or 1 and n being at least 1.

26. The forming process of claim 1 wherein said composition further includes a thermoplastic elastomer block copolymer having the formula $W_p$—$(Z-W)_q$ where Z is a polyethylene or ethylene-propylene copolymer block, W is a thermoplastic block, and p and q represent the average block numbers in said copolymer, p being 0 or 1 and q being at least 1.

27. The forming process of claim 1 wherein said copolymer has the formula $$\left(\begin{array}{c} Y \\ | \\ X \end{array}\right)_n$$

where Y is a backbone comprising isoprene or butadiene units, X is a thermoplastic graft-chain, and n represents the average graft-chain numbers in said copolymer, n being at least 1.

28. The forming process of claim 1 wherein said composition further includes a copolymer having the formula $$\left(\begin{array}{c} Z \\ | \\ W \end{array}\right)_q$$

where Z is a polyethylene or ethylene-propylene copolymer backbone, W is a thermoplastic graft-chain, and q represents the average graft-chain numbers in said copolymer, q being at least 1.

29. The forming process of claim 1 including dielectric filler selected from the group consisting of quartz and fused amorphous silica.

30. The forming process of claim 1 wherein curing is accomplished in the absence of a curative agent.

31. The forming process of claim 24 wherein said polybutadiene or polyisoprene resin comprises a liquid resin and wherein said syndiotactic 1,2 polybutadiene rubber is combined with said liquid resin.

32. A forming process for producing an article comprising:
providing a thermosetting composition comprising a polybutadiene or polyisoprene resin, and an unsaturated butadiene or isoprene containing copolymer capable of participating in crosslinking with said polybutadiene or polyisoprene resin, said copolymer is a styrene-butadiene-styrene triblock copolymer; and
curing said composition to produce said article by subjecting said composition to a high temperature cure condition in an inert atmosphere at a temperature greater than about 250° C. and less than the decomposition temperature of said composition.

33. The forming process of claim 32 wherein:
said polybutadiene or polyisoprene resin is liquid at room temperature.

34. The forming process of claim 32 wherein:
said polybutadiene or polyisoprene resin has a number average molecular weight less than 5,000.

35. The forming process of claim 32 wherein:
said unsaturated butadiene or isoprene containing copolymer comprises a solid polymer.

36. The forming process of claim 32 wherein:
said unsaturated butadiene or isoprene containing copolymer comprises a liquid polymer.

37. The forming process of claim 32 wherein:
said polybutadiene or polyisoprene resin includes pendent vinyl groups available for crosslinking.

38. The forming process of claim 32 wherein:
said unsaturated butadiene or isoprene containing copolymer has pendent vinyl groups available for crosslinking.

39. The forming process of claim 32 wherein:
said copolymer further comprises a styren-ethylene-propylene-styrene triblock copolymer.

40. The forming process of claim 32 further comprising:
adding to said composition one or more fillers.

41. The forming process of claim 40 wherein:
said filler is a dielectric filler selected from the group consisting of titanium dioxide, barium titanate, strontium titanate, silica, corundum, wollastonite, polytetrafluoroethylene, aramide fibers, fiberglass, $Ba_2Ti_9O_{20}$, glass spheres, boron nitride, aluminum nitride, silicon carbide, beryllia, and magnesia.

42. The forming process of claim 40 wherein:
a plurality of said fillers having different dielectric constants are employed, the respective quantities of said fillers being selected to provide to said article a preselected dielectric constant.

43. The forming process of claim 40 wherein:
said composition comprises between 5 and 80% volume, inclusive, of said filler.

44. The forming process of claim 43 further including:
a woven web impregnated by said polybutadiene or polyisoprene resin.

45. The forming process of claim 43 further comprising:
applying to said article a metal layer having a preselected coefficient of thermal expansion and, in the process of forming said article, selecting said filler and the quantity thereof to provide to said article a coefficient of thermal expansion substantially equal to that of said metal layer.

46. The forming process of claim 32 further comprising:
adding a crosslinking agent to said thermosetting composition.

47. The forming process of claim 46 wherein:
said crosslinking agent is selected from the group consisting of triallyl cyanurate, diallyl phthalate, divinylbenzene, a multifunctional acrylate monomer, and a combination thereof.

48. The forming process of claim 32 wherein:
curing said composition further includes a step of adding catalyst to said composition and subjecting said composition, prior to said high temperature cure, to a catalyzed cure at a temperature less than the temperature of said high temperature cure.

49. The forming process of claim 32 wherein said thermosetting composition includes:
syndiotactic 1,2-polybutadiene rubber in combination with said polybutadiene or polyisoprene resin.

50. The forming process of claim 49 wherein:
said polybutadiene or polyisoprene resin comprises a liquid resin and wherein said syndiotactic 1,2 polybutadiene rubber is combined with said liquid resin.

51. The forming process of claim 32 wherein curing said composition further includes:
subjecting said composition, prior to said high temperature cure, to a catalyzed cure at a temperature less than the temperature of said high temperature cure.

52. The forming process of claim 32 further including:
a dielectric filler selected from the group consisting of quartz and amorphous fused silica.

53. The forming process of claim 32 wherein:
curing is accomplished in the absence of a curing agent.

54. A form process for producing an article comprising:
providing a thermosetting composition comprising a polybutadiene or polyisoprene resin, and a syndiotactic 1,2-polybutadiene rubber; and
curing said composition to produce said article by subjecting said composition to a high temperature cure condition in an inert atmosphere at a temperature greater than about 250° C. and less than the decomposition temperature of said composition.

55. The forming process of claim 54 wherein:
said polybutadiene or polyisoprene resin comprises a liquid resin and wherein said syndiotactic 1,2 polybutadiene rubber is combined with said liquid resin.

56. The forming process of claim 54 wherein:
said polybutadiene or polyisoprene resin is liquid at room temperature.

57. The forming process of claim 54 wherein:
said polybutadiene or polyisoprene resin has a number average molecular weight less than 5,000.

58. The forming process of claim 54 wherein said thermosetting composition includes:
an unsaturated butadiene containing copolymer capable of participating in crosslinking with said polybutadiene or polyisoprene resin.

59. The forming process of claim 58 wherein:
said unsaturated butadiene or isoprene containing copolymer comprises a solid polymer.

60. The forming process of claim 58 wherein:
said unsaturated butadiene or isoprene containing copolymer comprises a liquid polymer.

61. The forming process of claim 58 wherein:
said polybutadiene or polyisoprene resin includes pendent vinyl groups available for crosslinking.

62. The forming process of claim 58 wherein:
said unsaturated butadiene or isoprene containing copolymer has pendent vinyl groups available for crosslinking.

63. The forming process of claim 58 wherein:
said copolymer is a copolymer of isoprene or butadiene and a second monomer and wherein said second monomer is styrene or α-methyl styrene.

64. The forming process of claim 58 wherein:
said copolymer is a thermoplastic elastomer block copolymer having the formula $X_m$—$(Y$—$X)_n$ where formula Y is a block comprising isoprene or butadiene units, X is a thermoplastic block, and m and n represent the average block numbers in said copolymer, m being 0 or 1 and n being at least 1.

65. The forming process of claim 58 wherein:
said copolymer has the formula

where Y is a backbone comprising isoprene or butadiene units, X is a thermoplastic graft-chain, and n represents the average graft-chain numbers in said copolymer, n being at least 1.

66. The forming process of claim 54 wherein:
said copolymer is a styrene-butadiene-styrene triblock copolymer.

67. The forming process of claim 66 wherein:
said copolymer further comprises a styrene-ethylene-propylenestyrene triblock copolymer.

68. The forming process of claim 54 further comprising:
adding to said composition one or more fillers.

69. The forming process of claim 68 wherein:
said filler is a dielectric filler selected from the group consisting of titanium dioxide, barium titanate, strontium titanate, silica, corundum, wollastonite, polytetrafluoroethylene, aramide fillers, fiberglass, $Ba_2Ti_9O_{20}$, glass spheres, boron nitride, aluminum nitride, silicon carbide, beryllia and magnesia.

70. The forming process of claim 68 wherein:
a plurality of said fillers having different dielectric constants are employed, the respective quantities of said fillers being selected to provide to said article a preselected dielectric constant.

71. The forming process of claim 68 wherein:
said composition comprises between 5 and 80% volume, inclusive, of said filler.

72. The forming process of claim 71 further including:
a woven web impregnated by said polybutadiene or polyisoprene resin.

73. The forming process of claim 71 further comprising:
applying to said article a metal layer having a preselected coefficient of thermal expansion and, in the process of forming said article, selecting said filler and the quantity thereof to provide to said article a coefficient of thermal expansion substantially equal to that of said metal layer.

74. The forming process of claim 54 further including:
a woven web impregnated by said polybutadiene or polyisoprene resin.

75. The forming process of claim 54 further comprising:
adding a crosslinking agent to said thermosetting composition.

76. The forming process of claim 75 wherein:
said crosslinking agent is selected from the group consisting of triallyl cyanurate, diallyl phthalate, divinylbenzene, a multifunctional acrylate monomer, and a combination thereof.

77. The forming process of claim 54 wherein curing said composition further includes:
adding catalyst to said composition and subjecting said composition, prior to said high temperature cure, to a catalyzed cure at a temperature less than the temperature of said high temperature cure.

78. The forming process of claim 54 wherein said composition further includes:
a thermoplastic elastomer block copolymer having the formula $W_p$—$(Z$—$W)_q$ where Z is a polyethylene or ethylene-propylene copolymer block, W is a thermoplastic block, and p and q represent the average block numbers in said copolymer, p being 0 or 1 and q being at least 1.

79. The forming process of claim 54 wherein said composition further includes:
a copolymer having the formula

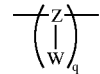

where Z is a polyethylene or ethylene-propylene copolymer backbone, W is a thermoplastic graft-chain, and q represents the average graft-chain numbers in said copolymer, q being at least 1.

80. The forming process of claim 54 further including:
a dielectric filler selected from the group consisting of quartz and fused amorphous silica.

81. The forming process of claim 54 wherein:
curing is accomplished in the absence of a curative agent.

* * * * *

UNITED STATES PATENT AND TRADEMARK OFFICE
CERTIFICATE OF CORRECTION

PATENT NO. : 6,586,533 B1
APPLICATION NO. : 08/238178
DATED : July 1, 2003
INVENTOR(S) : Vincent R. Landi et al.

It is certified that error appears in the above-identified patent and that said Letters Patent is hereby corrected as shown below:

Title Page:
Item (56), References Cited, Other Publications, after "Takeuchi, et al., "Thermoplastics 1,2", delete "13";

Column 2:
Line 46, after "with", delete "thee" and insert therefor --the--;
Line 59, after "or", delete "polyisoprene containing" and insert therefor --polyisoprene-containing--;

Column 7:
Line 43, after "fiberglass", delete "Ba2Ti$_9$O$_{20}$" and insert therefor --Ba$_2$Ti$_9$O$_{20}$--;

Column 9:
Table 2, before "peroxide", delete "dicuml" and insert therefor --DICUMYL--;
Line 48, after "proof", delete ",";

Columns 11/12:
After "Table 4", insert

-- Notes [1] and [2] To Table 4

1    The "flat" rating was measured by etching the copper foil off one face and observing the resulting curl of the laminate. The rating scale was ±0-5, with 0 being flat and 5 curling up into a tube. The sign of the rating indicates the direction of the curl, with "-" meaning the ends of the laminate curled toward the copper side of the laminate.

2    The "brittle" test was a test based on audible and visual cracking of the laminate when bent. Its rating ranged from 0-5 with 5 being extremely brittle. --

Column 13:
Line 53, after "13", delete "therein" and insert therefor --wherein--;

Column 14:
Line 1, after "21", delete "therein" and insert therefor --wherein--;

UNITED STATES PATENT AND TRADEMARK OFFICE
CERTIFICATE OF CORRECTION

PATENT NO. : 6,586,533 B1
APPLICATION NO. : 08/238178
DATED : July 1, 2003
INVENTOR(S) : Vincent R. Landi et al.

It is certified that error appears in the above-identified patent and that said Letters Patent is hereby corrected as shown below:

Column 15:
Line 23, after "a", delete "styren" and insert therefor --styrene--;

Column 16:
Line 40, after "butadiene" insert --or isoprene--;

Column 17:
Line 18, before "triblock", delete "propylenestyrene" and insert therefore --propylene-styrene--.

Signed and Sealed this

Twenty-fourth Day of July, 2007

JON W. DUDAS
*Director of the United States Patent and Trademark Office*